(12) United States Patent
Qin

(10) Patent No.: US 12,549,156 B2
(45) Date of Patent: Feb. 10, 2026

(54) RECEIVE FILTER WITH BULK ACOUSTIC WAVE RESONATORS

(71) Applicant: SKYWORKS SOLUTIONS, INC., Irvine, CA (US)

(72) Inventor: Shihan Qin, Fresno, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 128 days.

(21) Appl. No.: 18/131,615

(22) Filed: Apr. 6, 2023

(65) Prior Publication Data

US 2023/0327647 A1  Oct. 12, 2023

Related U.S. Application Data

(60) Provisional application No. 63/362,838, filed on Apr. 12, 2022.

(51) Int. Cl.
*H03H 9/60* (2006.01)
*H03H 9/02* (2006.01)

(52) U.S. Cl.
CPC ........ *H03H 9/605* (2013.01); *H03H 9/02086* (2013.01)

(58) Field of Classification Search
CPC .............. H03H 9/605; H03H 9/02086; H03H 9/02228; H03H 9/587; H03H 9/589; H03H 7/1758; H03H 9/542
See application file for complete search history.

(56) References Cited

U.S. PATENT DOCUMENTS

| | | | |
|---|---|---|---|
| 10,211,799 B2 * | 2/2019 | Tani | H03H 9/542 |
| 2008/0252397 A1 * | 10/2008 | Stuebing | H03H 9/605 |
| | | | 333/189 |
| 2014/0266511 A1 * | 9/2014 | Turner | G06F 30/327 |
| | | | 716/104 |
| 2020/0028487 A1 * | 1/2020 | Caron | H03H 9/02228 |
| 2020/0028489 A1 * | 1/2020 | Ta | H03H 9/205 |

* cited by examiner

*Primary Examiner* — John W Poos
(74) *Attorney, Agent, or Firm* — Lando & Anastasi, LLP

(57) ABSTRACT

A radio frequency ladder filter comprises a plurality of series bulk acoustic wave (BAW) resonators electrically connected in series between an input and an output, at least one BAW resonator connected between a node between adjacent ones of the plurality of series BAW resonators and ground, at least one shunt resonator element including an inductor and a capacitor in series and electrically coupled to ground between the input and a first of the plurality of series resonators, and at least one last shunt resonator element including an inductor and a capacitor in series and electrically coupled to ground between the output and a last of the plurality of series resonators.

20 Claims, 6 Drawing Sheets

RECEIVE FILTER WITH BULK ACOUSTIC WAVE RESONATORS

CROSS-REFERENCE TO RELATED APPLICATIONS

This application claims priority under 35 U.S.C. § 119(e) to U.S. Provisional Application Ser. No. 63/362,838, titled "RECEIVE FILTER WITH BULK ACOUSTIC WAVE RESONATORS," filed Apr. 12, 2022, the entire content of which is incorporated herein by reference in its entirety for all purposes.

BACKGROUND

Technical Field

Embodiments of this disclosure relate to acoustic wave filters, and more specifically to ladder filters having a wide passband.

Description of Related Technology

Acoustic wave devices, for example, bulk acoustic wave (BAW) devices may be utilized as components of filters in radio frequency electronic systems. For instance, filters in a radio frequency front end of a mobile telephone can include acoustic wave filters. Two acoustic wave filters can be arranged as a duplexer or a diplexer.

SUMMARY

In accordance with one aspect, there is provided a radio frequency ladder filter. The radio frequency ladder filter comprises a plurality of series bulk acoustic wave (BAW) resonators electrically connected in series between an input and an output, at least one BAW resonator connected between a node between adjacent ones of the plurality of series BAW resonators and ground, at least one shunt resonator element including an inductor and a capacitor in series and electrically coupled to ground between the input and a first of the plurality of series resonators, and at least one last shunt resonator element including an inductor and a capacitor in series and electrically coupled to ground between the output and a last of the plurality of series resonators.

In some embodiments, the radio frequency ladder filter further comprises an additional BAW resonator electrically connected in parallel with the at least one shunt resonator element.

In some embodiments, the radio frequency ladder filter further comprises an additional BAW resonator electrically connected in parallel with the at least one last shunt resonator element.

In some embodiments, the at least one BAW resonator includes a first shunt BAW resonator and a second shunt BAW resonator electrically connected in parallel.

In some embodiments, at least one of the series BAW resonators is a film bulk acoustic wave resonator.

In some embodiments, at least one of the series BAW resonators is a Lamb wave resonator.

In some embodiments, at least one of the series BAW resonators is a solidly mounted resonator.

In some embodiments, at least one of the shunt BAW resonators is a film bulk acoustic wave resonator.

In some embodiments, at least one of the shunt BAW resonators is a Lamb wave resonator.

In some embodiments, at least one of the shunt BAW resonators is a solidly mounted resonator.

In some embodiments, the radio frequency ladder filter further comprises an inductor connected in series with the at least one BAW resonator between ground and the node between the adjacent ones of the plurality of series BAW resonators.

In some embodiments, the radio frequency filter has a passband between 4.4 GHz and GHz.

In some embodiments, the radio frequency filter has S21 transmission parameter values of greater than −2.3 dB throughout the passband.

In some embodiments, the radio frequency filter in included in a radio frequency device module.

In some embodiments, the radio frequency device module is included in a radio frequency device.

In accordance with another aspect, there is provided a method of forming a radio frequency ladder filter. The method comprises forming a plurality of series bulk acoustic wave (BAW) resonators electrically connected in series between an input and an output, forming at least one BAW resonator connected between a node between adjacent ones of the plurality of series BAW resonators and ground, forming at least one shunt resonator element including an inductor and a capacitor in series and electrically coupled to ground between the input and a first of the plurality of series resonators, and forming at least one last shunt resonator element including an inductor and a capacitor in series and electrically coupled to ground between the output and a last of the plurality of series resonators.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
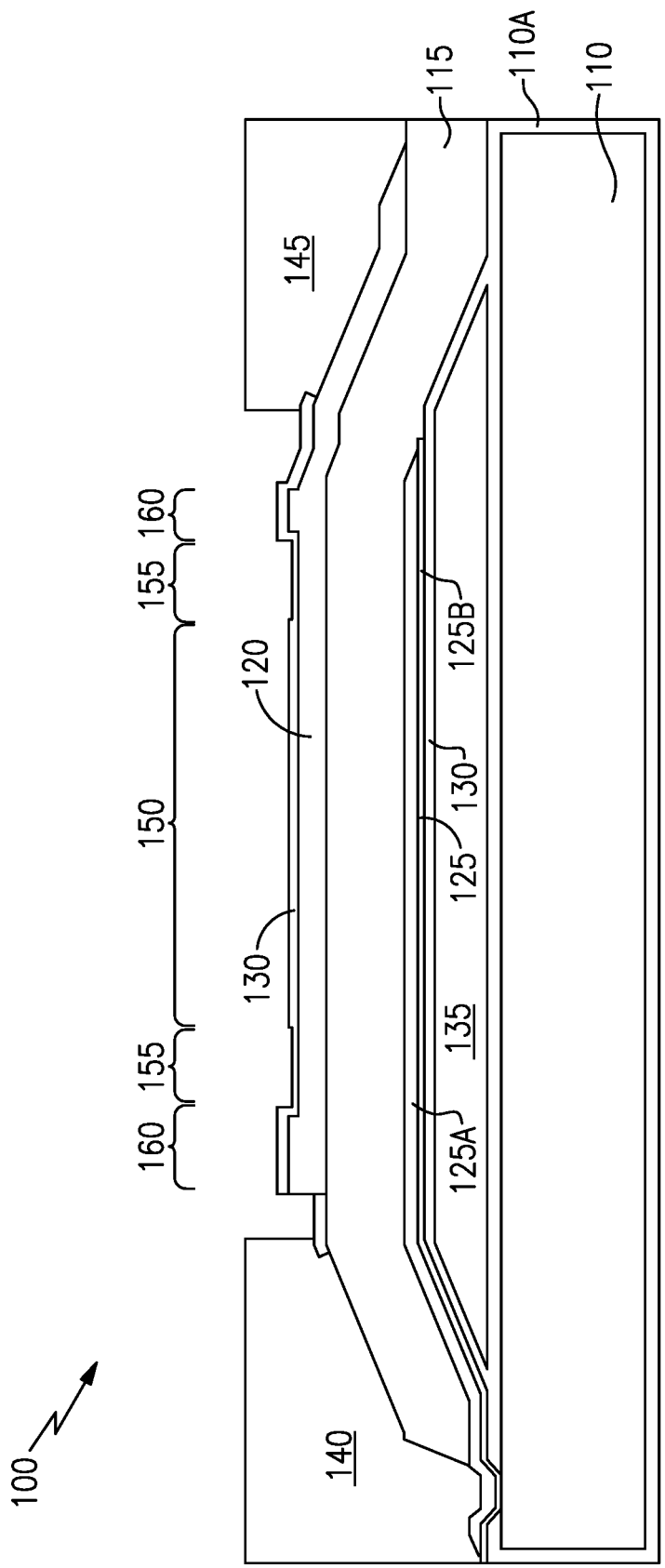
FIG. 1 is a simplified cross-sectional view of a bulk acoustic wave resonator having a film bulk acoustic wave configuration.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments disclosed herein are generally directed to BAW resonator ladder filters that are modified to increase the width of their passbands.

Operators of cellular telephone networks are switching to utilizing frequency bands for voice and data communication in what is commonly referred to a fifth generation new radio (5G NR) bandwidths. Some of the 5G NR bands have wider bandwidths or wider fractional bandwidths (bandwidth divided by frequency at center of band) than third or fourth generation radio communication technologies. In one example, the N79 communication band includes frequencies between about 4.4 GHz and 5 GHz, a fractional bandwidth of about 13%. The high end of the N79 band is very close to the 5G WiFi band (5.15 GHz to 5.85 GHz). The low end of the N79 band is very close to the N77 5G NR band (3.3 GHz to 4.2 GHz). To maintain low losses within the passband of wide bandwidth radio frequency bands such as the N79 band, while rejecting signals from adjacent bands, for example, the 5G WiFi and N77 bands, it is typically preferable to utilize a filter formed with bulk acoustic wave (BAW) resonators rather than surface acoustic wave (SAW) resonators. It may be difficult, however, to achieve the wide passband required by some 5G NR communication bands with radio frequency filters utilizing solely BAW resonators as the resonating elements. It may be easier to achieve the wide passband required by some 5G NR communication bands with radio frequency filters using inductor-capacitor based resonators (LC filters), although such filters are typically significantly larger than BAW-based filters, which is a disadvantage given the amount of functionality and associated circuitry that consumers demand be included within the form factor of modern cellular telephones. Accordingly, in some aspects and embodiments disclosed herein, a radio frequency filter includes both BAW resonators and inductors and capacitors (LC elements) to achieve both wide bandwidth and high out of band signal rejection.

FIG. 1 is cross-sectional view of an example of a bulk acoustic wave resonator having a film bulk acoustic wave resonator (FBAR) configuration, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric material layer 130 in the recessed frame region(s) 155 is typically etched during manufacturing to achieve a desired difference in acoustic velocity between the central region 150 and the recessed frame region(s) 155. Accordingly, the dielectric material layer 130 initially deposited in both the central region 150 and recessed frame region(s) 155 is deposited with a sufficient thickness that allows for etching of sufficient dielectric material layer 130 in the recessed frame region(s) 155 to achieve a desired difference in thickness of the dielectric material layer 130 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Another form of BAW resonator is a Lamb wave acoustic wave resonator. A Lamb wave resonator can combine features of a surface acoustic wave (SAW) resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW resonator (e.g., due to a suspended structure). A Lamb wave resonator that includes an AlN piezoelectric layer can be relatively easy to integrate with other circuits, for example, because AlN process technology can be compatible with complementary metal oxide semiconductor (CMOS) process technology. AlN Lamb wave resonators can overcome a relatively low resonance frequency limitation and integration challenge associated with SAW resonators and also overcome multiple frequency capability challenges associated with BAW resonators. Some Lamb wave resonator topologies are based on acoustic reflection from periodic reflective gratings. Some other Lamb wave resonator topologies are based on acoustic reflection from suspended free edges of a piezoelectric layer.

Figure 2:
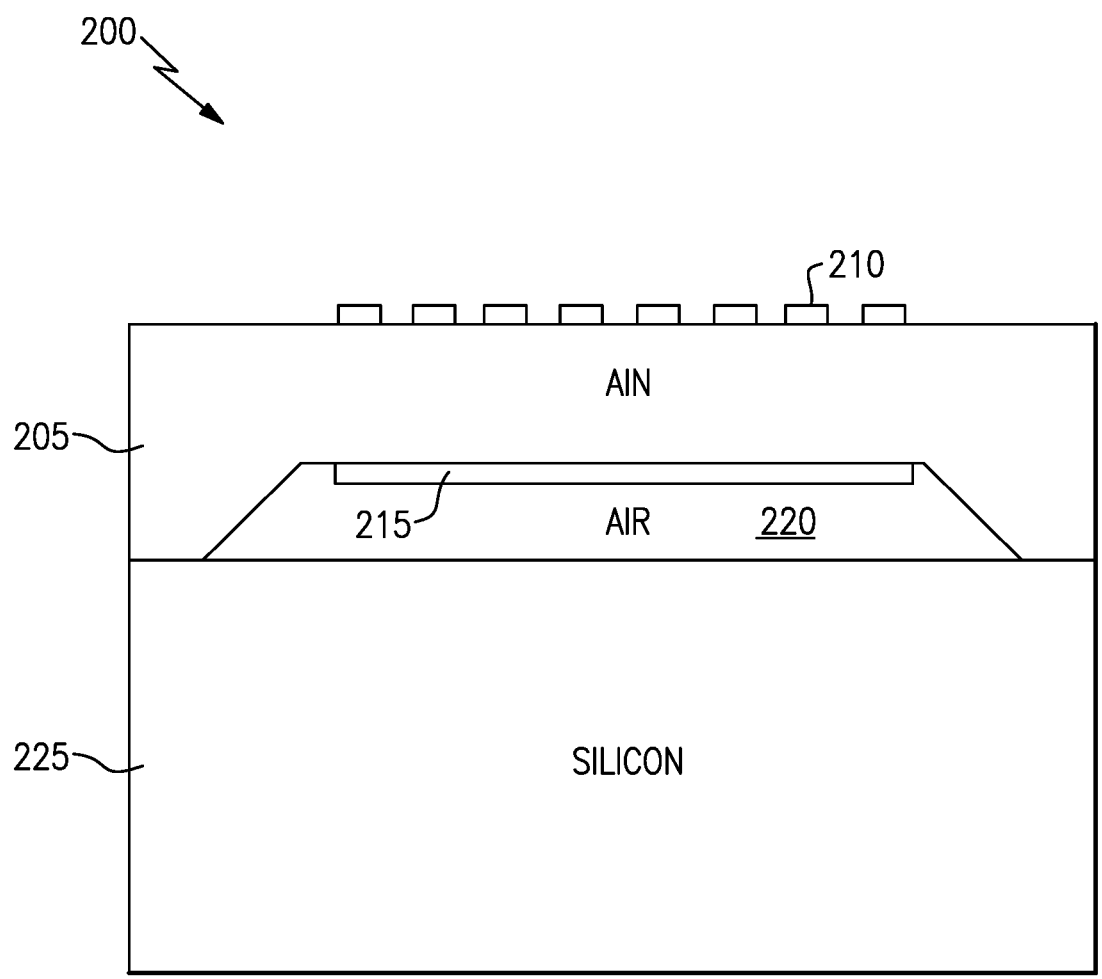
FIG. 2 is a simplified cross-sectional view of a bulk acoustic wave resonator having a Lamb wave resonator configuration.

An example of a Lamb wave acoustic wave resonator is indicated generally at 200 in FIG. 2. The Lamb wave resonator 200 includes features of a SAW resonator and an FBAR. As illustrated, the Lamb wave resonator 200 includes a piezoelectric layer 205, an interdigital transducer electrode (IDT) 210 on the piezoelectric layer 205, and a lower electrode 215 disposed on a lower surface of the piezoelectric layer 205. The piezoelectric layer 205 can be a thin film. The piezoelectric layer 205 can be an aluminum nitride layer. In other instances, the piezoelectric layer 205 can be any suitable piezoelectric layer. The frequency of the Lamb wave resonator can be based on the geometry of the IDT 210. The electrode 215 can be grounded in certain instances. In some other instances, the electrode 215 can be floating. An air cavity 220 is disposed between the electrode 215 and a semiconductor substrate 225. Any suitable cavity can be implemented in place of the air cavity 220, for example, a vacuum cavity or a cavity filled with a different gas.

Figure 3:
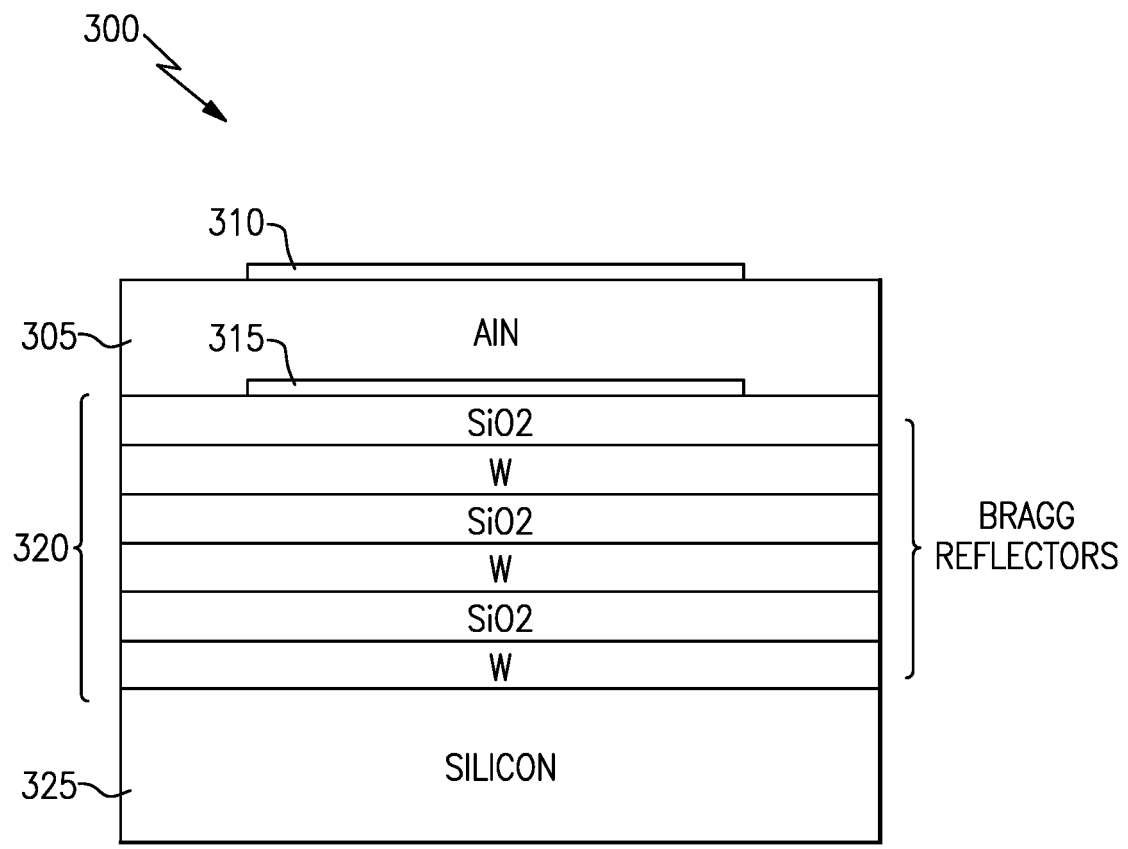
FIG. 3 is a simplified cross-sectional view of a bulk acoustic wave resonator having a solidly mounted resonator configuration.

Another form of BAW resonator is a solidly mounted resonator (SMR). An example of an SMR is illustrated generally at 300 in FIG. 3. As illustrated, the SMR 300 includes a piezoelectric layer 305, an upper electrode 310 on the piezoelectric layer 305, and a lower electrode 315 on a lower surface of the piezoelectric layer 305. The piezoelectric layer 305 can be an aluminum nitride layer. In other instances, the piezoelectric layer 305 can be any other suitable piezoelectric layer. The lower electrode 315 can be grounded in certain instances. In some other instances, the lower electrode 315 can be floating. Bragg reflectors 320 are disposed between the lower electrode 315 and a semiconductor substrate 325. The semiconductor substrate 325 can be a silicon substrate. Any suitable Bragg reflectors can be implemented. For example, the Bragg reflectors can be $SiO_2/W$.

Examples of bulk acoustic wave resonators as disclosed herein may be combined to form a ladder filter for a radio frequency device, for example, a cellular telephone. The bulk acoustic wave resonators may be any of film bulk acoustic wave resonators, Lamb wave resonators, solidly mounted resonators, or any combination of these types of resonators. A ladder filter may function as a band pass filter exhibiting low attenuation for signals within a certain frequency range, referred to as the passband of the filter, while exhibiting high attenuation for signals with frequencies above and below the passband, referred to as the stop bands of the filter. In accordance with various aspects and embodiments additional resonator structures formed from combinations of inductors and capacitors (LC elements) may also be included in a ladder filter to provide a wider passband than might be achieved in a ladder filter utilizing BAW resonators alone.

Figure 4:
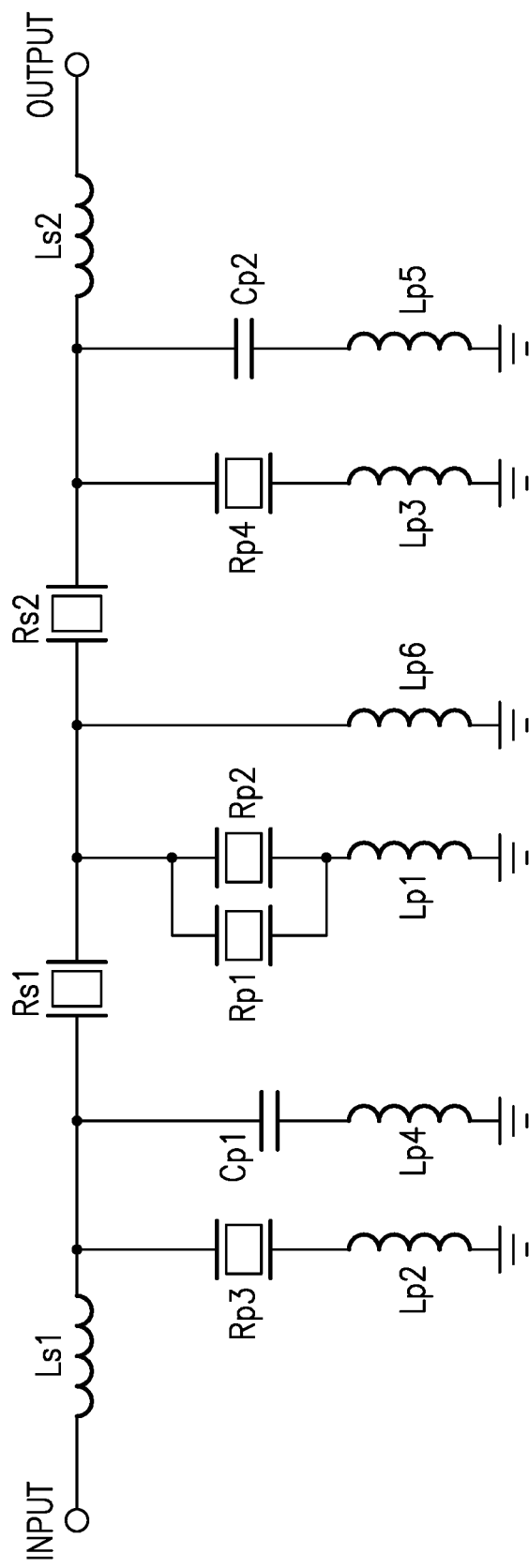
FIG. 4 is a simplified circuit diagram of an example of a ladder filter.

A circuit diagram for one example of a ladder filter configuration utilizing BAW resonators as well as LC resonator elements is illustrated in FIG. 4. The ladder filter includes series BAW resonators Rs1 and Rs2 electrically connected in series between the input and output of the filter. In instances where the ladder filter is used as a transmit side filter, the input may receive signals from a transmitter circuit of a device and the output may provide a filtered signal to an antenna of the device. In instances where the ladder filter is used as a receive side filter, the input may receive signals from an antenna of a device and the output may provide a filtered signal to a receiver circuit of the device. Inductors Ls1 and Ls2 are optionally provided in series between the filter input and Rs1 and between Rs2 and the filter output, respectively. The optional inductors Ls1 and Ls2 may help match input and output impedance of the filter with input and output circuitry to which the filter may be electrically attached. Shunt BAW resonators (also referred to as parallel arm resonators) Rp1 and Rp2 are provided in electrical communication between a node between series BAW resonators Rs1 and Rs2 and ground. Shunt BAW resonators Rp1 and Rp2 are electrically connected in parallel. In other embodiments, shunt BAW resonators Rp1 and Rp2 may be replaced by a single shunt BAW resonator. A third shunt BAW resonator Rp3 is electrically connected between a node between inductor Ls1 and series BAW resonator Rs1 and ground. A fourth shunt BAW resonator Rp4 is electrically connected between a node between inductor Ls2 and series BAW resonator Rs2 and ground. The shunt BAW resonators Rp1, Rp2, Rp3, and Rp4 are optionally connected in series with inductors Lp1-Lp3 electrically connected between respective shunt BAW resonators Rp1 and Rp2, Rp3, and Rp4 and ground as illustrated in FIG. 4.

As discussed above the ladder filter of FIG. 4 also includes LC resonator elements. The LC resonator elements include capacitor Cp1 and inductor Lp4 connected in series between a node between inductor Ls1 and series BAW resonator Rs1 and ground. Capacitor Cp1 and inductor Lp4 are connected in parallel with BAW resonator Rp3 and inductor Lp2. In FIG. 4 resonator Rp3 and inductor Lp2 are illustrated closer to the filter input than capacitor Cp1 and inductor Lp4, however, in other embodiments capacitor Cp1 and inductor Lp4 may be closer to the filter input than resonator Rp3 and inductor Lp2.

A second LC resonator element is formed from capacitor Cp2 and inductor Lp5, which are connected in series between a node between inductor Ls2 and series BAW resonator Rs2 and ground. Capacitor Cp2 and inductor Lp5 are connected in parallel with BAW resonator Rp4 and inductor Lp3. In FIG. 4 capacitor Cp2 and inductor Lp5 are illustrated closer to the filter output than resonator Rp4 and inductor Lp3, however, in other embodiments resonator Rp4 and inductor Lp3 may be closer to the filter output than capacitor Cp2 and inductor Lp5.

An additional inductor Lp6 may be provided electrically connected to a node between series BAW resonators Rs1 and Rs2 and ground. The inductor Lp6 is connected in parallel with the circuit element including shunt resonators Rp1 and Rp2 and inductor Lp1. In other embodiments, the positions of the inductor Lp6 and the circuit element including shunt resonators Rp1 and Rp2 and inductor Lp1 may be switched.

Figure 5:
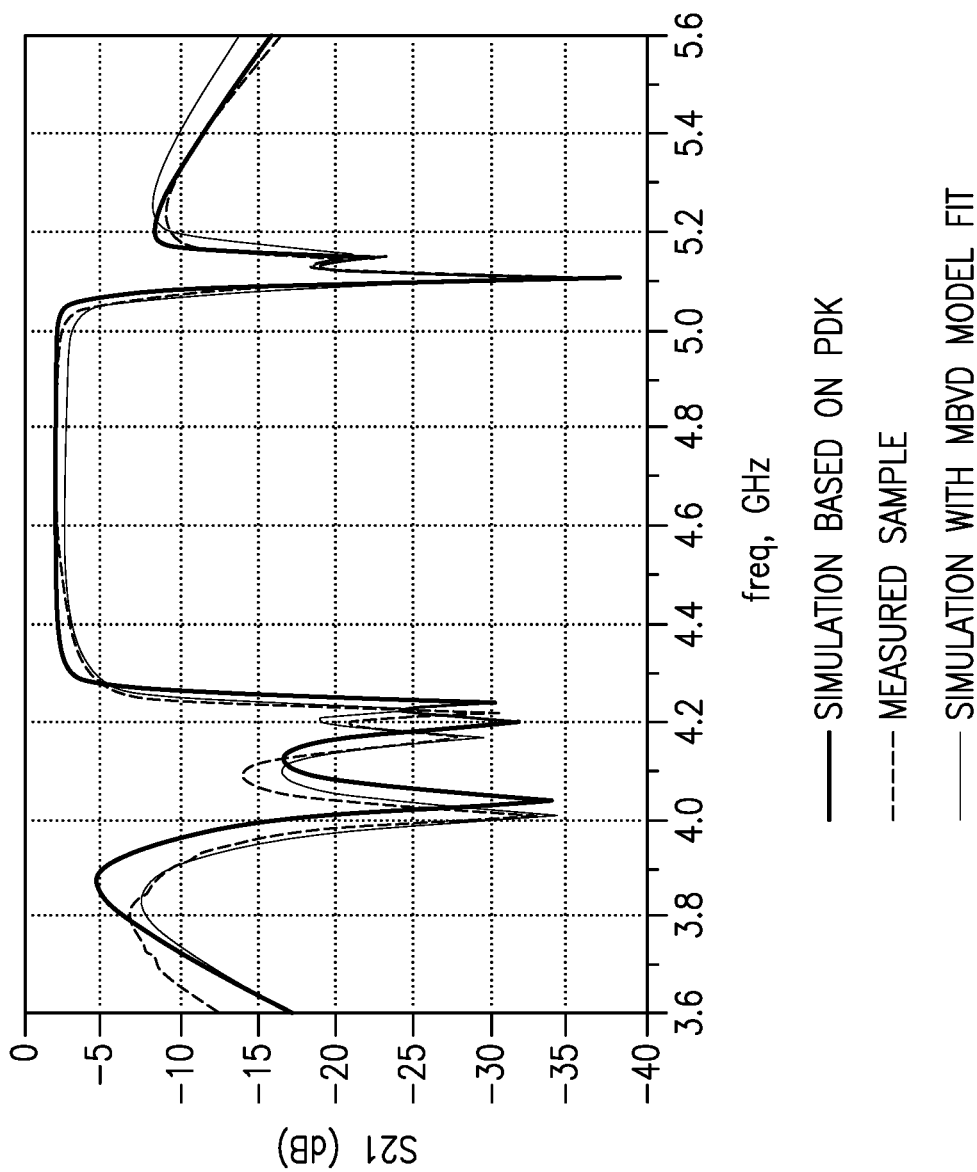
FIG. 5 is a chart of insertion loss vs. frequency of an example of a ladder filter as illustrated in FIG. 4.

FIG. 5 is a chart of the transmission parameter S21 as a function of frequency for a ladder filter as illustrated in FIG. 4 in which the resonant and anti-resonant frequencies of the BAW and LC resonators were selected to provide the filter with a passband for the N79 5G NR band. Both simulation by two different simulation methods and actual measurement results are illustrated. As illustrated, the filter exhibits high transmission throughout the N79 passband of 4.4 GHz-5 GHz with steep skirts on the upper and lower sides of the passband.

In alternate embodiments, the ladder filter of FIG. 4 may include a greater or fewer number of series and/or shunt resonators than illustrated.

Embodiments of the disclosed ladder filter and duplexers including can be used in a wide variety of electronic devices, such as RF front-end modules and communication devices.

Figure 6:
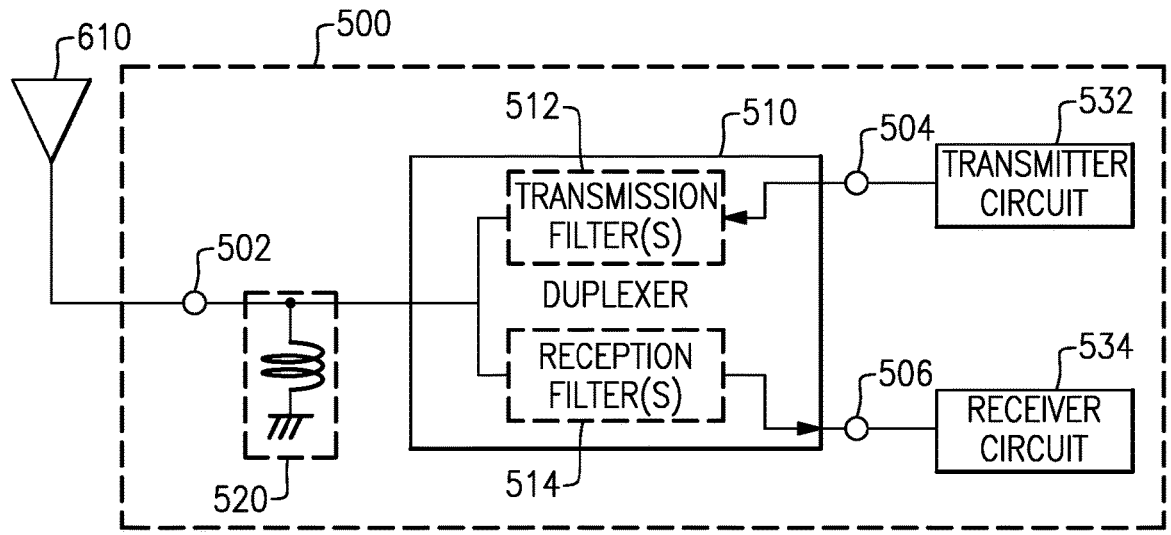
FIG. 6 is a block diagram of one example of a front-end module that can include one or more duplexers according to aspects of the present disclosure.

Referring to FIG. 6, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filters. Examples of the SAW and/or BAW filters disclosed herein can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 6, however, in other embodiments these components may be integrated into a common transceiver circuit or module. As will be appreciated by those skilled in the art, the front-end module 500 may include other components that are not illustrated in FIG. 6 including, but not limited to, switches, electromagnetic couplers, amplifiers, processors, and the like.

Figure 7:
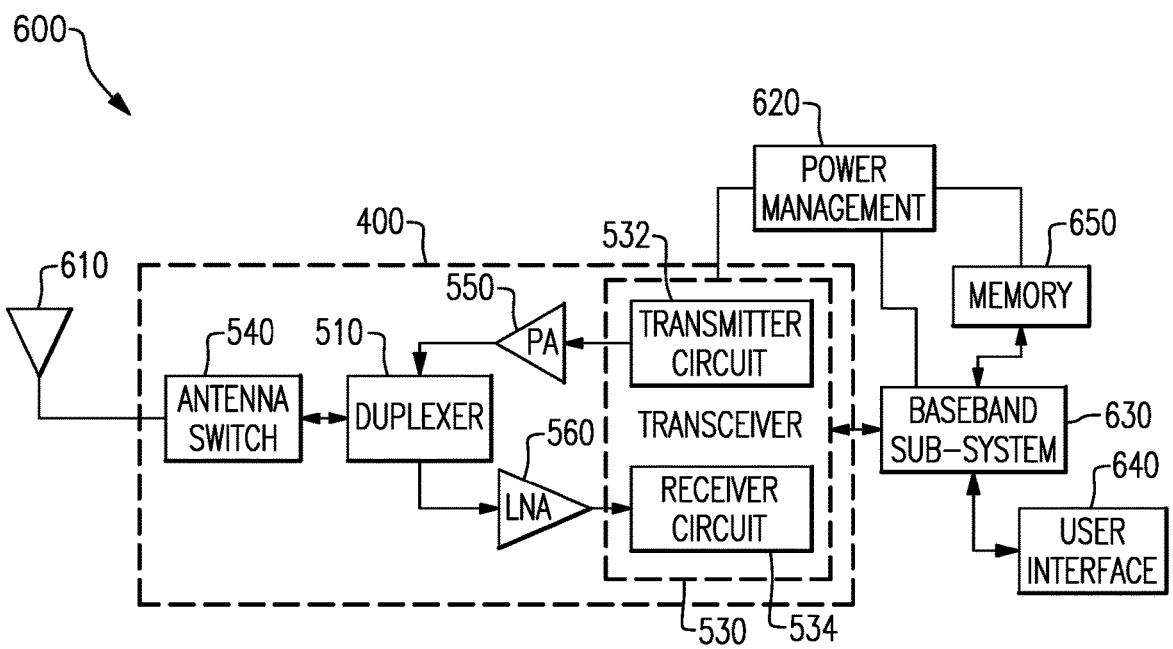
FIG. 7 is a block diagram of one example of a wireless device including the front-end module of FIG. 6.

FIG. 7 is a block diagram of one example of a wireless device 600 including the antenna duplexer 510 shown in FIG. 6. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 6. The front-end module 500 includes the duplexer 510, as discussed above. In the example shown in FIG. 7 the front-end module 500 further includes an antenna switch 540, which can be configured to switch between different frequency bands or modes, such as transmit and receive modes, for example. In the example illustrated in FIG. 7, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 7.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 7, the front-end module 500 may further include a low noise amplifier module 560, which amplifies received signals from the antenna 610 and provides the amplified signals to the receiver circuit 534 of the transceiver 530.

The wireless device 600 of FIG. 7 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices.

Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency ladder filter comprising:
a plurality of series bulk acoustic wave (BAW) resonators electrically connected in series between an input and an output;
at least one shunt BAW resonator connected between a node between adjacent ones of the plurality of series BAW resonators and ground;
at least one shunt resonator element including an inductor and a capacitor in series and electrically coupled to ground between the input and a first of the plurality of series BAW resonators, the first of the plurality of series BAW resonators being closest to the input among all of the plurality of series BAW resonators;
a first additional BAW resonator electrically connected in parallel with the at least one shunt resonator element and coupled to ground between the input and the first of the plurality of series BAW resonators;
at least one last shunt resonator element including an inductor and a capacitor in series and electrically coupled to ground between the output and a last of the plurality of series BAW resonators, the last of the plurality of series BAW resonators being closest to the output among all of the plurality of series BAW resonators; and
a second additional BAW resonator electrically connected in parallel with the at least one last shunt resonator element and electrically coupled to ground between the output and the last of the plurality of series BAW resonators.

2. The radio frequency ladder filter of claim 1 wherein the at least one shunt BAW resonator includes a first shunt BAW resonator and a second shunt BAW resonator electrically connected in parallel.

3. The radio frequency ladder filter of claim 1 wherein at least one of the plurality of series BAW resonators is a film bulk acoustic wave resonator.

4. The radio frequency ladder filter of claim 1 wherein at least one of the plurality of series BAW resonators is a Lamb wave resonator.

5. The radio frequency ladder filter of claim 1 wherein at least one of the plurality of series BAW resonators is a solidly mounted resonator.

6. The radio frequency ladder filter of claim 1 wherein the at least one shunt BAW resonator is a film bulk acoustic wave resonator.

7. The radio frequency ladder filter of claim 1 wherein the at least one shunt BAW resonator is a Lamb wave resonator.

8. The radio frequency ladder filter of claim 1 wherein the at least one shunt BAW resonator is a solidly mounted resonator.

9. The radio frequency ladder filter of claim 1 further comprising an inductor connected in series with the at least one shunt BAW resonator between ground and the node between the adjacent ones of the plurality of series BAW resonators.

10. The radio frequency ladder filter of claim 1 having a passband between 4.4 GHz and 5 GHz.

11. The radio frequency ladder filter of claim 10 having S21 transmission parameter values of greater than −2.3 dB throughout the passband.

12. A radio frequency device including a radio frequency device module having a radio frequency ladder filter comprising:
a plurality of series bulk acoustic wave (BAW) resonators electrically connected in series between an input and an output;
at least one shunt BAW resonator connected between a node between adjacent ones of the plurality of series BAW resonators and ground;
at least one shunt resonator element including an inductor and a capacitor in series and electrically coupled to ground between the input and a first of the plurality of series BAW resonators, the first of the plurality of series BAW resonators being closest to the input among all of the plurality of series BAW resonators;
a first additional BAW resonator electrically connected in parallel with the at least one shunt resonator element and coupled to ground between the input and the first of the plurality of series BAW resonators;
at least one last shunt resonator element including an inductor and a capacitor in series and electrically coupled to ground between the output and a last of the plurality of series BAW resonators, the last of the plurality of series BAW resonators being closest to the output among all of the plurality of series BAW resonators; and
a second additional BAW resonator electrically connected in parallel with the at least one last shunt resonator element and electrically coupled to ground between the output and the last of the plurality of series BAW resonators.

13. A method of forming a radio frequency ladder filter, the method comprising:
forming a plurality of series bulk acoustic wave (BAW) resonators electrically connected in series between an input and an output;
forming at least one BAW resonator connected between a node between adjacent ones of the plurality of series BAW resonators and ground;
forming at least one shunt resonator element including an inductor and a capacitor in series and electrically coupled to ground between the input and a first of the plurality of series BAW resonators, the first of the plurality of series BAW resonators being closest to the input among all of the plurality of series BAW resonators;
forming a first additional BAW resonator electrically connected in parallel with the at least one shunt resonator element and coupled to ground between the input and the first of the plurality of series BAW resonators;
forming at least one last shunt resonator element including an inductor and a capacitor in series and electrically coupled to ground between the output and a last of the plurality of series BAW resonators, the last of the plurality of series BAW resonators being closest to the output among all of the plurality of series BAW resonators; and
forming a second additional BAW resonator electrically connected in parallel with the at least one last shunt resonator element and electrically coupled to ground between the output and the last of the plurality of series BAW resonators.

14. The radio frequency ladder filter of claim 1 further comprising an inductor connected in series between the first of the plurality of series BAW resonators and the input.

15. The radio frequency ladder filter of claim 1 further comprising an inductor connected in series between the last of the plurality of series BAW resonators and the output.

16. The radio frequency ladder filter of claim 1 further comprising an inductor connected in series between the first additional BAW resonator and ground.

17. The radio frequency ladder filter of claim 1 further comprising an inductor connected in series between the second additional BAW resonator and ground.

18. The radio frequency device of claim 12 further comprising one of an inductor connected in series between the first of the plurality of series BAW resonators and the input, or an inductor connected in series between the last of the plurality of series BAW resonators and the output.

19. The method of claim 13 further comprising forming an inductor connected in series between the first of the plurality of series BAW resonators and the input.

20. The method of claim 13 further comprising forming an inductor connected in series between the last of the plurality of series BAW resonators and the output.

* * * * *